United States Patent
Irie et al.

(10) Patent No.: US 9,773,963 B2
(45) Date of Patent: Sep. 26, 2017

(54) METHOD FOR CONNECTING PIEZOELECTRIC ELEMENT AND CABLE SUBSTRATE, PIEZOELECTRIC ELEMENT HAVING CABLE SUBSTRATE, AND INKJET HEAD INCLUDING PIEZOELECTRIC ELEMENT WITH CABLE SUBSTRATE

(71) Applicant: Panasonic Intellectual Property Management Co., Ltd., Osaka (JP)

(72) Inventors: Kazunobu Irie, Hyogo (JP); Futoshi Ohtsuka, Kyoto (JP); Takeshi Kita, Hyogo (JP); Motoi Hatanaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/044,181

(22) Filed: Feb. 16, 2016

(65) Prior Publication Data

US 2016/0163955 A1 Jun. 9, 2016

Related U.S. Application Data

(62) Division of application No. 14/707,101, filed on May 8, 2015, now Pat. No. 9,293,683.

(30) Foreign Application Priority Data

May 12, 2014 (JP) .................................. 2014-098219

(51) Int. Cl.
*B41J 2/045* (2006.01)
*H01L 41/047* (2006.01)
(Continued)

(52) U.S. Cl.
CPC .......... *H01L 41/047* (2013.01); *B23K 1/0016* (2013.01); *B23K 31/02* (2013.01);
(Continued)

(58) Field of Classification Search
None
See application file for complete search history.

(56) References Cited

U.S. PATENT DOCUMENTS

| 5,505,364 A | 4/1996 | Plesinger |
| 6,241,346 B1 | 6/2001 | Takahashi |

(Continued)

FOREIGN PATENT DOCUMENTS

| JP | 63-090876 | 6/1988 |
| JP | 11-105285 | 4/1999 |

(Continued)

*Primary Examiner* — Erica Lin
(74) *Attorney, Agent, or Firm* — Wenderoth, Lind & Ponack, L.L.P.

(57) ABSTRACT

A connection method includes softening a resin film of a thermosetting resin by heating an element electrode of a piezoelectric body and a substrate electrode of a flexible cable to be connected to the piezoelectric body with the element electrode and the substrate electrode being pressed into contact with each other via the resin film; partially pushing out the molten resin film from an opposing position of the element electrode and the substrate electrode so as to bring a solder layer provided on the substrate electrode into contact with the element electrode; curing the resin film and melting solder in the solder layer by further raising a heating temperature; discharging excess solder in a direction defined by the cured resin film; and then solidifying the solder in the solder layer so as to solder the element electrode and the substrate electrode together.

11 Claims, 15 Drawing Sheets

(51) Int. Cl.
  *H01L 41/053* (2006.01)
  *B23K 31/02* (2006.01)
  *B41J 2/14* (2006.01)
  *B41J 2/16* (2006.01)
  *B23K 1/00* (2006.01)
  *H01L 41/29* (2013.01)
  *H01L 41/08* (2006.01)
  *H01L 41/083* (2006.01)
  *H01L 41/338* (2013.01)
  *H01L 41/273* (2013.01)

(52) U.S. Cl.
  CPC ....... *B41J 2/14201* (2013.01); *B41J 2/14209* (2013.01); *B41J 2/14274* (2013.01); *B41J 2/1609* (2013.01); *B41J 2/1623* (2013.01); *H01L 41/0475* (2013.01); *H01L 41/053* (2013.01); *H01L 41/08* (2013.01); *H01L 41/29* (2013.01); *B41J 2002/14491* (2013.01); *H01L 41/083* (2013.01); *H01L 41/273* (2013.01); *H01L 41/338* (2013.01)

(56) References Cited

U.S. PATENT DOCUMENTS

| | | |
|---|---|---|
| 6,575,565 B1 | 6/2003 | Isono |
| 2002/0017142 A1 | 2/2002 | Kitahara |
| 2002/0156373 A1 | 10/2002 | Wakabayashi |
| 2003/0076385 A1 | 4/2003 | Okazawa |
| 2004/0027034 A1 | 2/2004 | Kawaguchi |
| 2004/0113994 A1 | 6/2004 | Shinkai |
| 2004/0251783 A1 | 12/2004 | Kanaya |
| 2004/0256955 A1 | 12/2004 | Okazawa |
| 2005/0017601 A1 | 1/2005 | Hiyoshi |
| 2005/0062802 A1 | 3/2005 | Kawamura |
| 2005/0068374 A1 | 3/2005 | Sagara |
| 2005/0212867 A1 | 9/2005 | Nagashima |
| 2007/0138914 A1 | 6/2007 | Ishikawa |
| 2007/0222822 A1 | 9/2007 | Ito |
| 2007/0257968 A1* | 11/2007 | Hashimoto .......... B41J 2/14274 347/72 |
| 2008/0238261 A1* | 10/2008 | Ohashi ................ H01L 41/0533 310/340 |
| 2008/0239024 A1 | 10/2008 | Sugahara |
| 2008/0259133 A1 | 10/2008 | Hara |
| 2009/0051737 A1 | 2/2009 | Takeuchi |
| 2009/0056129 A1 | 3/2009 | Takeuchi |
| 2009/0096842 A1 | 4/2009 | Kubo |
| 2010/0194825 A1 | 8/2010 | Togashi |
| 2010/0244629 A1 | 9/2010 | Nagashima |
| 2010/0271735 A1 | 10/2010 | Schreiber |
| 2011/0051290 A1 | 3/2011 | Inoue |
| 2011/0242225 A1 | 10/2011 | Yamashita |
| 2013/0233278 A1 | 9/2013 | Sato |
| 2013/0257226 A1 | 10/2013 | Nobles |
| 2014/0055932 A1 | 2/2014 | Nakamura |
| 2014/0062263 A1 | 3/2014 | Ogawa |
| 2014/0063126 A1 | 3/2014 | Yamashita |
| 2014/0192498 A1 | 7/2014 | Rathbun |
| 2014/0202629 A1 | 7/2014 | Uetani |
| 2014/0218886 A1 | 8/2014 | Nomura |
| 2014/0368086 A1 | 12/2014 | Bindig |
| 2015/0001998 A1 | 1/2015 | Katsuta |
| 2015/0015341 A1 | 1/2015 | Kojo |
| 2015/0022058 A1 | 1/2015 | Okamura |
| 2015/0155470 A1 | 6/2015 | Mori |
| 2015/0162521 A1 | 6/2015 | Kojo |
| 2015/0243876 A1 | 8/2015 | Ozawa |
| 2015/0243877 A1 | 8/2015 | Ozawa |
| 2015/0300894 A1 | 10/2015 | Robutel |
| 2015/0311423 A1 | 10/2015 | Murakami |

FOREIGN PATENT DOCUMENTS

| | | |
|---|---|---|
| JP | 2000-108345 | 4/2000 |
| JP | 2000108345 A * | 4/2000 |
| JP | 2002-110269 | 4/2002 |

* cited by examiner

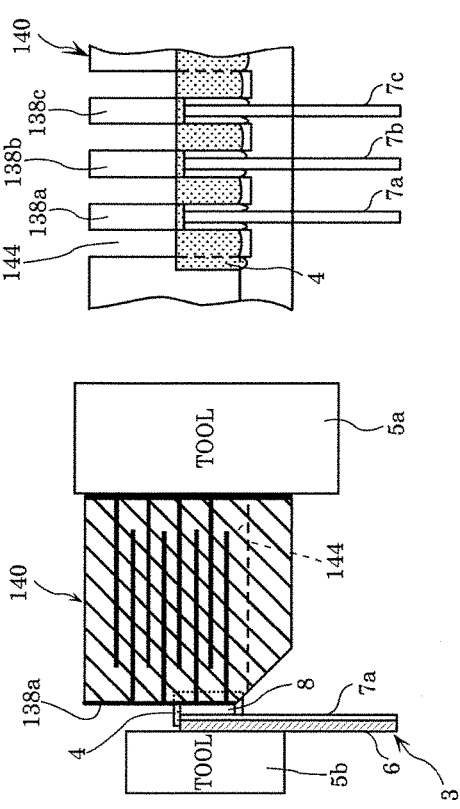
FIG. 3A
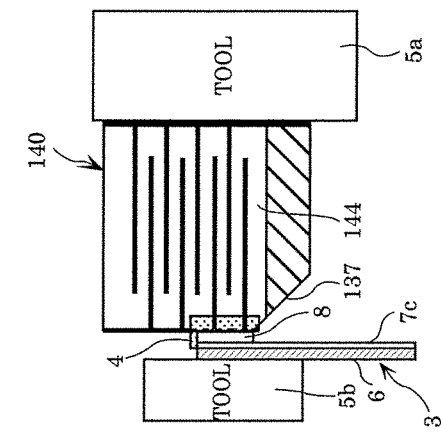
FIG. 3B
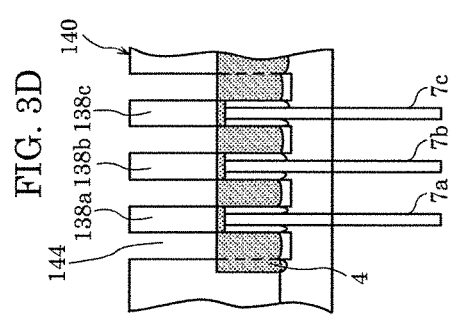
FIG. 3C
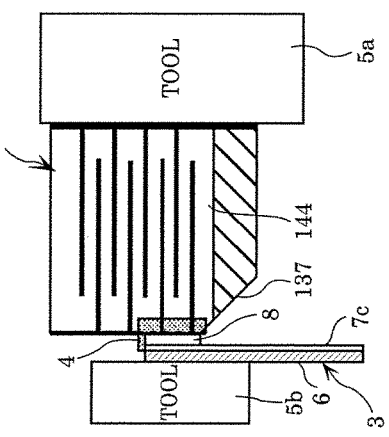
FIG. 3D
FIG. 3E

METHOD FOR CONNECTING PIEZOELECTRIC ELEMENT AND CABLE SUBSTRATE, PIEZOELECTRIC ELEMENT HAVING CABLE SUBSTRATE, AND INKJET HEAD INCLUDING PIEZOELECTRIC ELEMENT WITH CABLE SUBSTRATE

CROSS REFERENCE TO RELATED APPLICATION

The present application is based on and claims priority from Japanese Patent Application No. 2014-098219 filed on May 12, 2014. The entire disclosure of the above-identified application, including the specification, drawings and claims is incorporated herein by reference in its entirety.

BACKGROUND OF THE INVENTION

1. Field of the Invention

The present disclosure relates to an inkjet head. In particular, the present disclosure relates to an inkjet head used as a production apparatus.

2. Description of the Related Art

In recent years, there has been a growing demand for larger screens and higher pixel resolution in various displays.

Among those displays, an organic light emitting diode display (in the following, referred to as an OLED display) is produced by either a deposition method of placing a substrate of the display in a vacuum and depositing an organic layer on the substrate or a printing method of applying ink prepared by dissolving a material of the organic layer in a solvent onto pixels of the display under atmospheric pressure. The printing method is more advantageous for production of a large screen display.

The printing method usable for the production of the OLED display includes a plurality of printing techniques. Among these printing techniques, an inkjet technique is appropriate in view of an utilization efficiency of the material.

In order to improve the pixel resolution of the OLED display by the inkjet technique, a high-density inkjet head having a reduced distance between nozzle holes is needed.

The inkjet head includes a piezoelectric element that applies pressure to ink. The piezoelectric element is provided for each of the nozzles.

In order to apply a voltage to each piezoelectric element, a flexible cable including a wire is used. A control device and each of the piezoelectric elements are connected by the flexible cable. The piezoelectric elements are aligned with a fine pitch. Thus, when the flexible cable and the piezoelectric element are poorly connected, adjacent piezoelectric elements are short-circuited, causing a problem of reduced production yields.

Japanese Unexamined Utility Model Registration Application Publication No. 63-90876 discloses a technique illustrated in FIG. 16.

FIG. 16 is a plan view illustrating cable 21 to be connected to a piezoelectric element. Cable 21 includes a plurality of substrate electrodes 23 that are formed adjacent to each other on insulating substrate 22. Furthermore, holes 24 are formed in advance on insulating substrate 22 between tips of substrate electrodes 23. Holes 24 collect excess solder when substrate electrodes 23 are connected to the piezoelectric elements. This prevents a short-circuit between substrate electrodes 23.

Japanese Unexamined Patent Application Publication No. 2002-110269 discloses a technique illustrated in FIG. 17. FIG. 17 is an enlarged perspective view illustrating connector 27.

A plurality of adjacent connector electrodes 25 are provided on insulating substrate 26. Connector 27 further includes recesses 28 that are formed between connector electrodes 25. When connector 27 is soldered to element electrodes of the inkjet head, recesses 28 collect overflowing solder. This prevents a short-circuit between adjacent connector electrodes 25.

When a piezoelectric element including adjacent piezoelectric bodies and a flexible cable including a plurality of adjacent substrate electrodes provided on an insulating substrate are soldered to each other, it is conceivable that excess solder that has overflowed from the substrate electrodes is collected into holes 24 or recesses 28 by forming holes 24 on the insulating substrate as described in Japanese Unexamined Utility Model Registration Application Publication No. 63-90876 or by forming recesses 28 on the insulating substrate as described in Japanese Unexamined Patent Application Publication No. 2002-110269.

However, when the substrate electrode achieves a finer pitch, it is difficult to provide holes 24 or recesses 28 having an effective size on the insulating substrate.

Moreover, when the excess solder enters between the adjacent piezoelectric bodies, it may solidify to form solder chips and cause a short-circuit.

SUMMARY OF THE INVENTION

With the foregoing conventional problems in mind, it is an object of the present disclosure to provide a method for connecting a piezoelectric element and a cable substrate and a piezoelectric element having a cable substrate that can more reliably prevent a short-circuit caused by excess solder that has overflowed from between substrate electrodes when connecting the cable substrate having the substrate electrodes with a fine pitch to the piezoelectric element.

A method for connecting a piezoelectric element and a cable substrate according to one aspect of the present disclosure includes softening a resin film by pressing against each other and heating a plurality of element electrodes located at the piezoelectric element and a plurality of substrate electrodes located on the cable substrate with the resin film and solder being sandwiched between the plurality of element electrodes and the plurality of substrate electrodes, each of the plurality of substrate electrodes having a shape of a line; curing the resin film by further heating the resin film that has been softened; melting the solder, and pushing out along the line a portion of the solder located at an opposing position by the pressing, the opposing position being a position where the plurality of element electrodes and the plurality of substrate electrodes are opposed to each other; and solidifying the solder between the plurality of substrate electrodes and the plurality of element electrodes.

A piezoelectric element with a cable substrate according to one aspect of the present disclosure includes a piezoelectric element including a plurality of piezoelectric bodies that are aligned via grooves; a cable substrate including a plurality of substrate electrodes that are aligned on an insulating substrate; first solder that connects the plurality of substrate electrodes and a plurality of element electrodes provided on surfaces of the plurality of piezoelectric bodies at a first opposing position where the plurality of substrate electrodes and the plurality of element electrodes are opposed to each other; and a thermosetting resin that is adjacent to the first solder and connects the plurality of piezoelectric bodies and the insulating substrate. The piezoelectric element has a cut-out portion that is adjacent to the plurality of element electrodes and defines a gap between the piezoelectric element and the plurality of substrate electrodes. The gap is greater than a gap between the plurality of element electrodes and the plurality of substrate electrodes at the first opposing position.

In this configuration, the element electrode and the substrate electrode are pressed into contact with each other and heated while the resin film formed of the thermosetting resin is sandwiched between the element electrode and the substrate electrode. In this manner, the resin film formed of the thermosetting resin is softened by heating. The softened resin film is partially pushed out from the opposing position of the element electrode and the substrate electrode. In this way, the element electrode and the substrate electrode are connected via the solder layer that is in a solidified state.

Then, the heating temperature is raised so as to cure the resin film formed of the thermosetting resin. Thereafter, the solder layer melts. Even when excess solder is pushed out, the path of the solder is restricted by the resin film, so that no short-circuit occurs.

When the solder layer is melted by raising the heating temperature, the excess solder moves in a direction defined by the cured resin film. Thus, the excess solder does not move in an unwanted direction. Subsequently, the solder is solidified so as to complete soldering of the substrate electrode and the element electrode.

In this manner, the use of the resin film formed of the thermosetting resin can cause the excess solder to move in a direction crossing an alignment direction of a plurality of adjacent substrate electrodes or a direction crossing an alignment direction of a plurality of element electrodes. Accordingly, even when no recess or hole is provided between the substrate electrodes unlike the conventional case, it is possible to improve the reliability and prevent a short-circuit between adjacent piezoelectric bodies in a process of press-bonding and connecting a flexible cable having a fine wiring pitch and a piezoelectric element.

BRIEF DESCRIPTION OF THE DRAWINGS

These and other objects, advantages and features of the disclosure will become apparent from the following description thereof taken in conjunction with the accompanying drawings that illustrate a specific embodiment of the present disclosure.

FIG. 3A is a sectional view illustrating a main portion in a state where a resin film is softened in Embodiment 1;

FIG. 3B is a front view illustrating a state where the resin film is softened and the insulating substrate is omitted in Embodiment 1;

FIG. 3C is another sectional view illustrating the main portion in the state where the resin film is softened in Embodiment 1;

FIG. 3D is a front view illustrating a state where the resin film is softened in Embodiment 1;

FIG. 3E is another sectional view illustrating the main portion in the state where the resin film is softened in Embodiment 1;

DETAILED DESCRIPTION OF THE PREFERRED EMBODIMENTS

The following is a description of a method for connecting a piezoelectric element and a cable substrate, a piezoelectric element having a cable substrate, and an inkjet head including the piezoelectric element with the cable substrate according to embodiments of the present disclosure.

Embodiment 1

Figure 1A:
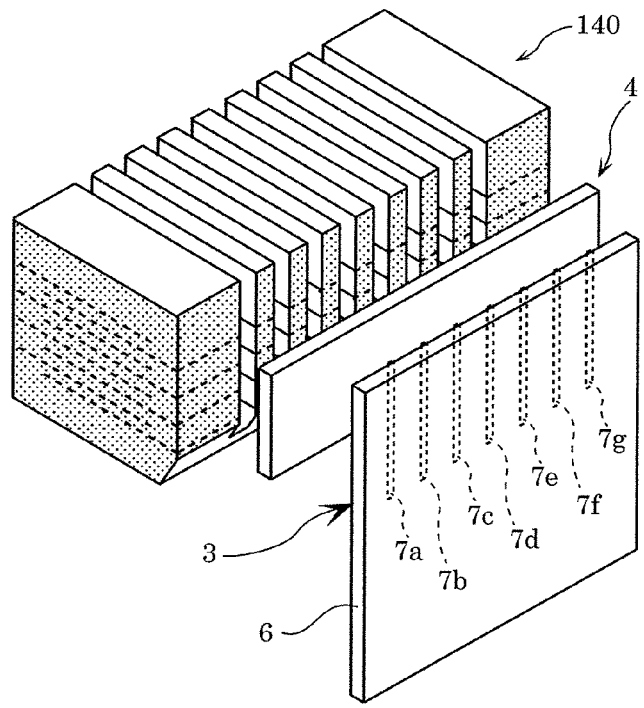
FIG. 1A is a perspective view illustrating shapes of individual components immediately before starting soldering a piezoelectric element with a cable substrate in Embodiment 1.
Figure 1B:
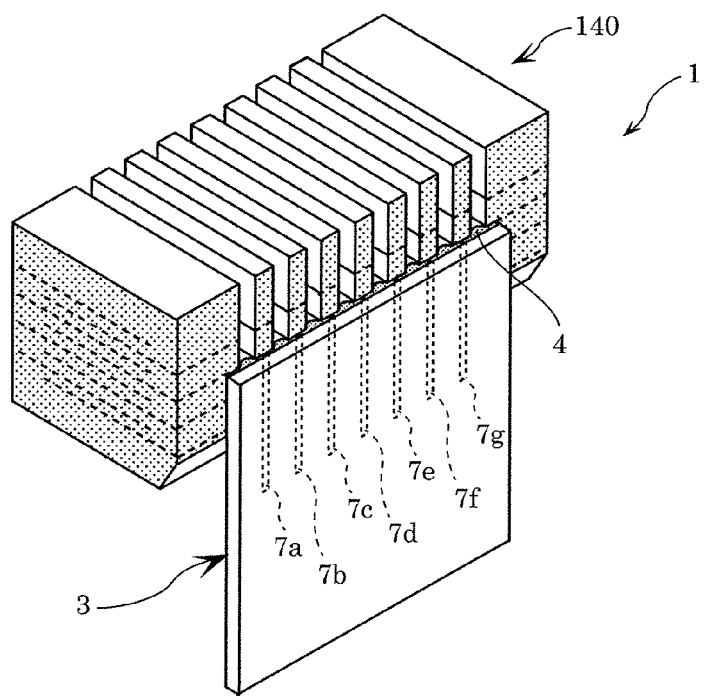
FIG. 1B is a perspective view illustrating the piezoelectric element with the cable substrate when the soldering of the piezoelectric element with the cable substrate is completed in Embodiment 1.
Figure 5A:
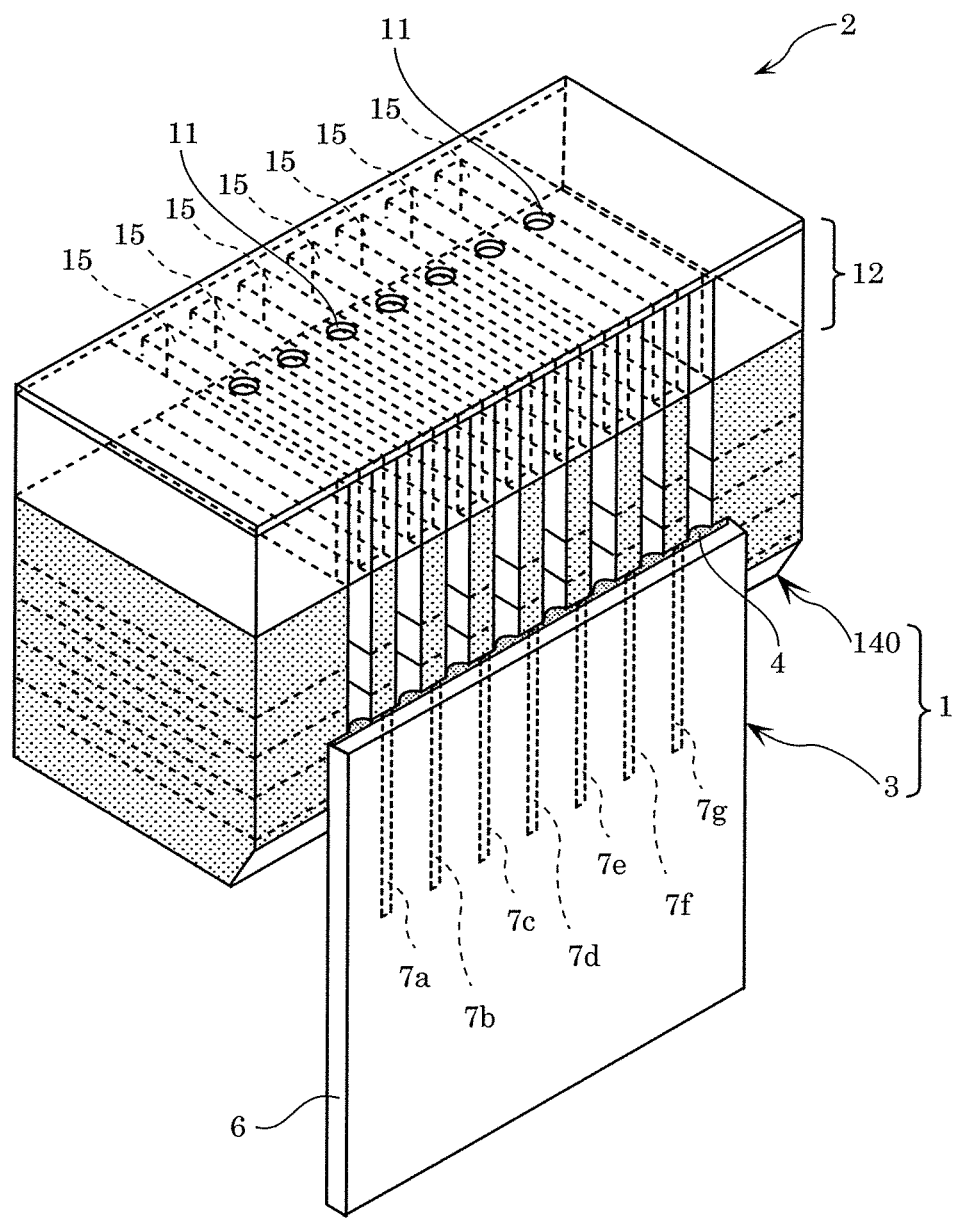
FIG. 5A is an enlarged perspective view illustrating an inkjet head including the piezoelectric element with the cable substrate in Embodiment 1.
Figure 5B:
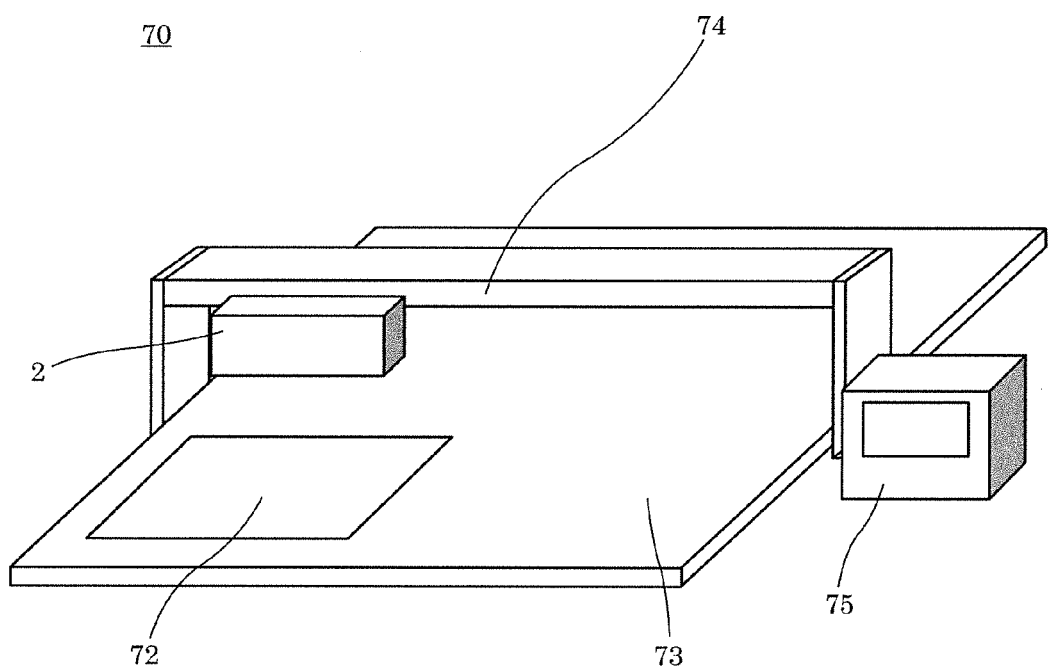
FIG. 5B is a perspective view illustrating an inkjet apparatus including the inkjet head including the piezoelectric element with the cable substrate in Embodiment 1.
Figure 6:
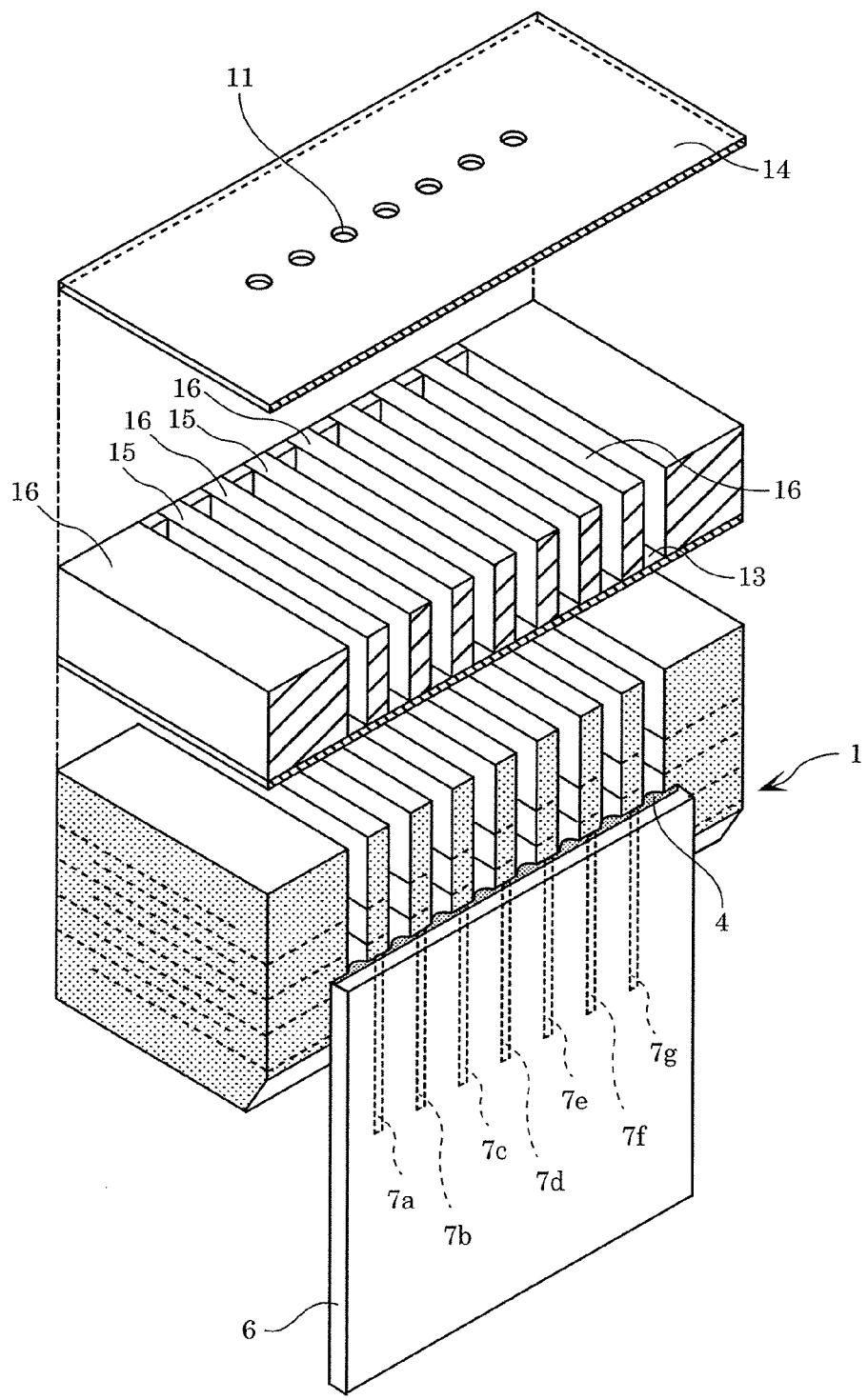
FIG. 6 is an exploded perspective view illustrating the inkjet head including the piezoelectric element with the cable substrate in Embodiment 1.

FIG. 1A is a perspective view illustrating shapes of individual components immediately before starting soldering of a piezoelectric element with a cable substrate. FIG. 1B is a perspective view illustrating piezoelectric element 1 with a cable substrate when the soldering is completed. FIG. 2A to FIG. 4E illustrate production processes of piezoelectric element 1 with the cable substrate. FIG. 5A illustrates inkjet head 2 including piezoelectric element 1 with the cable substrate. FIG. 5B illustrates inkjet apparatus 70 including inkjet head 2. FIG. 6 is an exploded perspective view illustrating inkjet head 2 that is partially cut out. FIG. 7A to FIG. 12 illustrate production processes of piezoelectric body 140.

(Production Process)

Figure 10A:
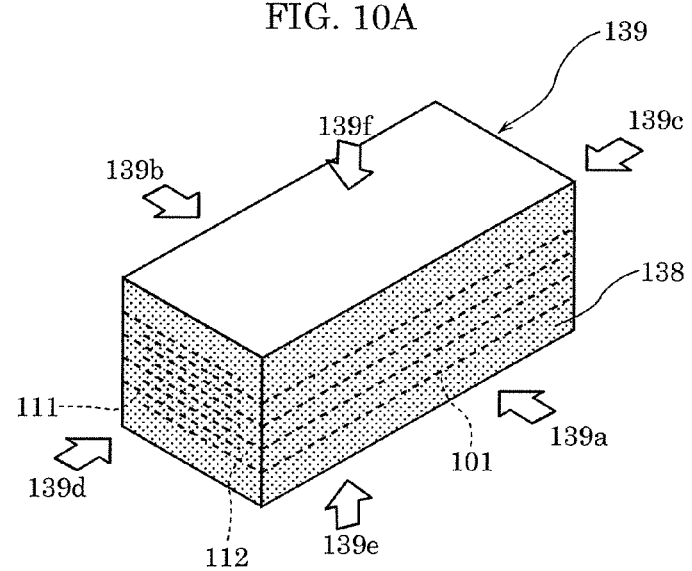
FIG. 10A is a perspective view illustrating the layered body on which an electrically-conductive film is formed.
Figure 11A:
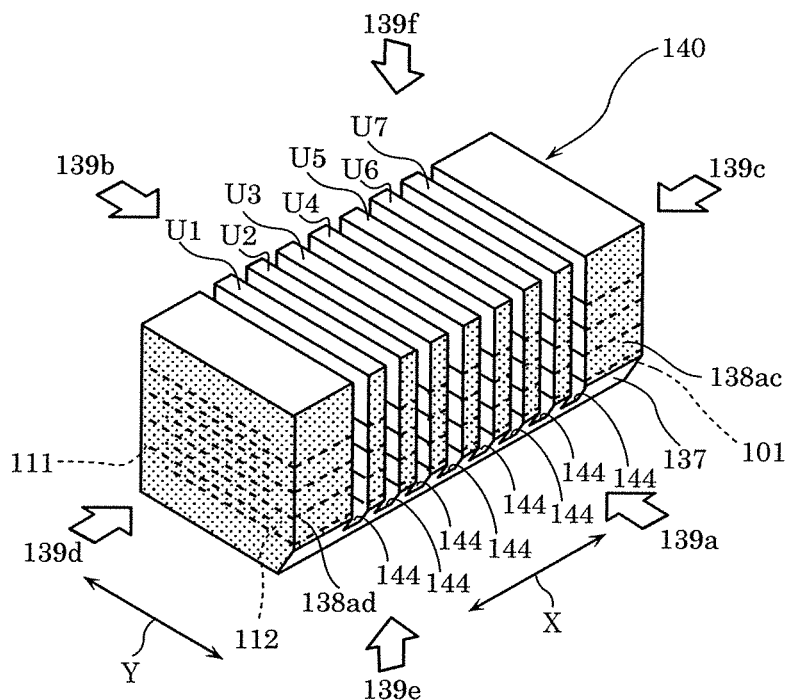
FIG. 11A is a perspective view illustrating a piezoelectric element obtained by forming a plurality of grooves in the layered body.

In the production of piezoelectric body 140, layered body 139 illustrated in FIG. 10A is first produced. Thereafter, as illustrated in FIG. 11A, a plurality of grooves 144 are formed in layered body 139, thus forming a plurality of adjacent piezoelectric bodies U1 to U7.

Layered body 139 is produced as follows.

Figure 7A:
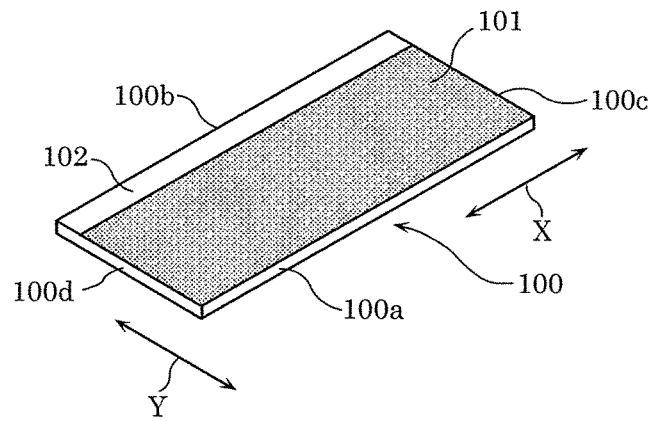
FIG. 7A is a perspective view illustrating a first sheet used for the piezoelectric element in Embodiment 1.
Figure 7B:
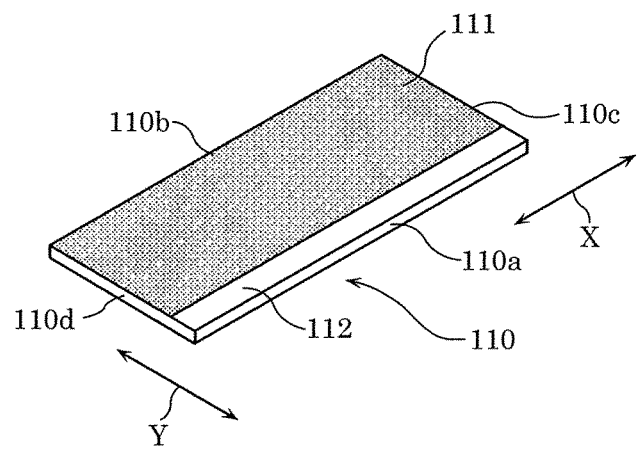
FIG. 7B is a perspective view illustrating a second sheet used in Embodiment 1.
Figure 7C:
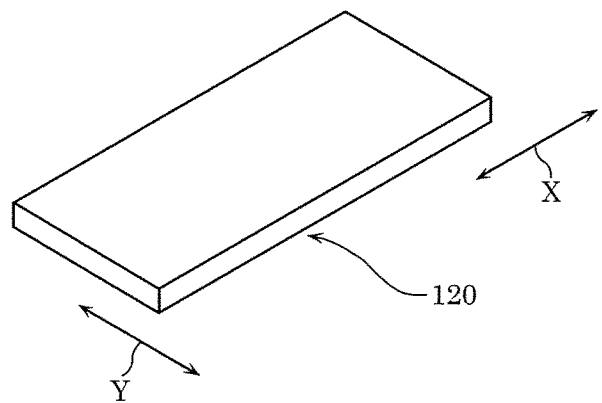
FIG. 7C is a perspective view illustrating a third sheet used in Embodiment 1.

FIG. 7A, FIG. 7B, and FIG. 7C are perspective views respectively illustrating first sheet 100, second sheet 110, and third sheet 120 of a piezoelectric body used for producing layered body 139. First sheet 100, second sheet 110, and third sheet 120 are pre-burned green sheets.

On an upper surface of first sheet 100 having a rectangular principal surface, rectangular first electrode 101 and first non-electrode region 102 are provided. An entire lower surface of first sheet 100 serves as a non-electrode region.

On an upper surface of second sheet 110 having a rectangular principal surface, rectangular second electrode 111 and second non-electrode region 112 are provided. An entire lower surface of second sheet 110 serves as a non-electrode region.

Both of an upper surface and a lower surface of third sheet 120 serve as a non-electrode region.

Electrode patterns of first electrode 101 and second electrode 111 are printed by screen printing or the like using, for example, silver paste. Furthermore, a single sheet of a pre-burned piezoelectric film may have a thickness ranging from 5 μm to 100 μm, desirably from 10 μm to 50 μm.

It should be noted that, in FIG. 7A to FIG. 7C, an X direction indicates a direction along a long side, and a Y direction indicates a direction along a short side.

First sheet 100 has first long side 100a and second long side 100b that are opposed to each other, and first short side 100c and second short side 100d that are opposed to each other.

One of long sides of first electrode 101 contacts first long side 100a. Short sides of first electrode 101 contact first short side 100c and second short side 100d, respectively.

Second sheet 110 has first long side 110a and second long side 110b that are opposed to each other, and first short side 110c and second short side 110d that are opposed to each other. Long sides of second electrode 111 are as long as first long side 110a and second long side 110b. Short sides of second electrode 111 are shorter than first short side 110c and second short side 110d. One of long sides of second electrode 111 contacts second long side 110b. Short sides of second electrode 111 contact first short side 110c and second short side 110d, respectively.

Figure 8:
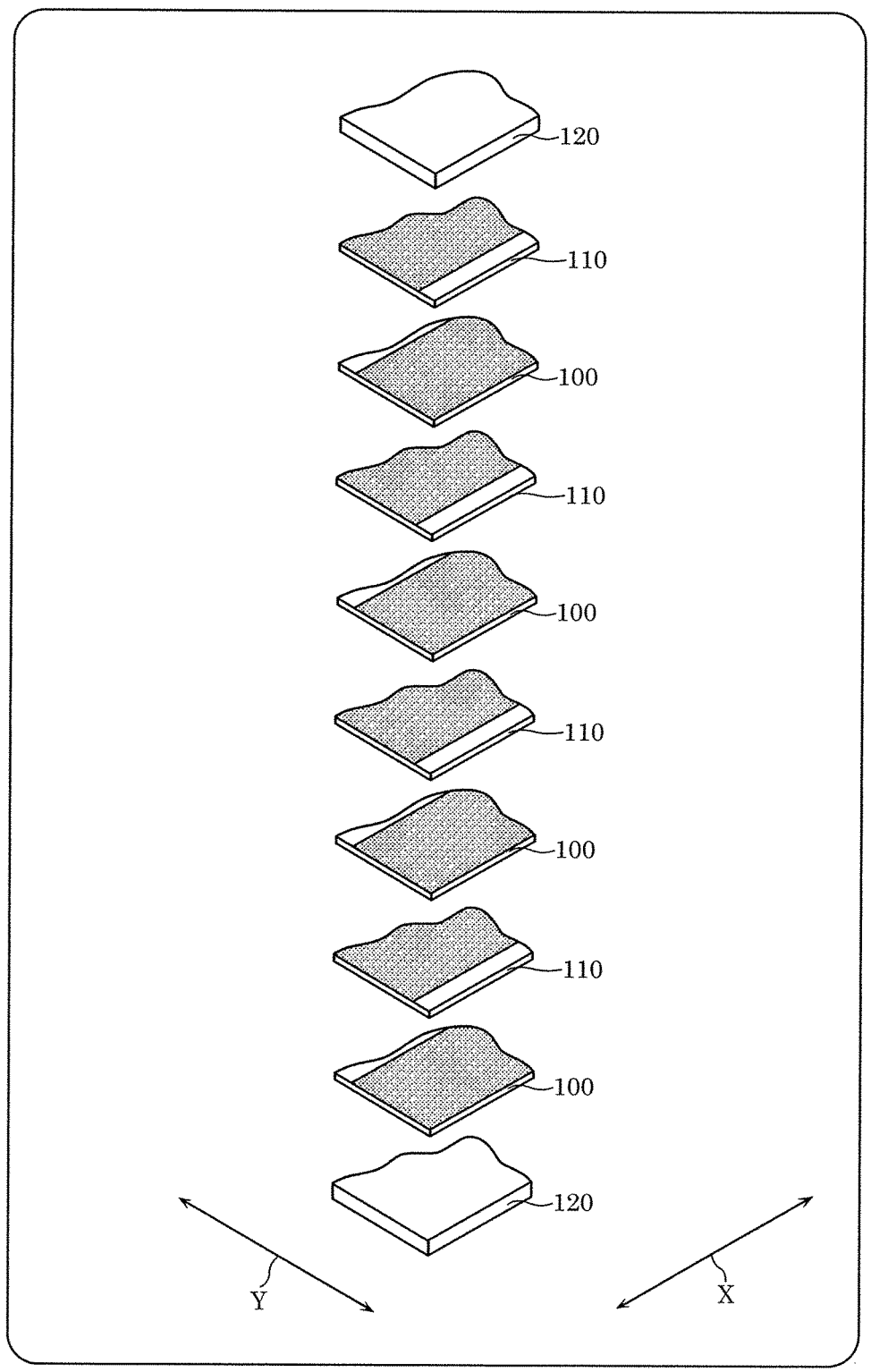
FIG. 8 is an exploded view illustrating a main portion showing how the first, second and third sheets are layered in Embodiment 1.
Figure 9:
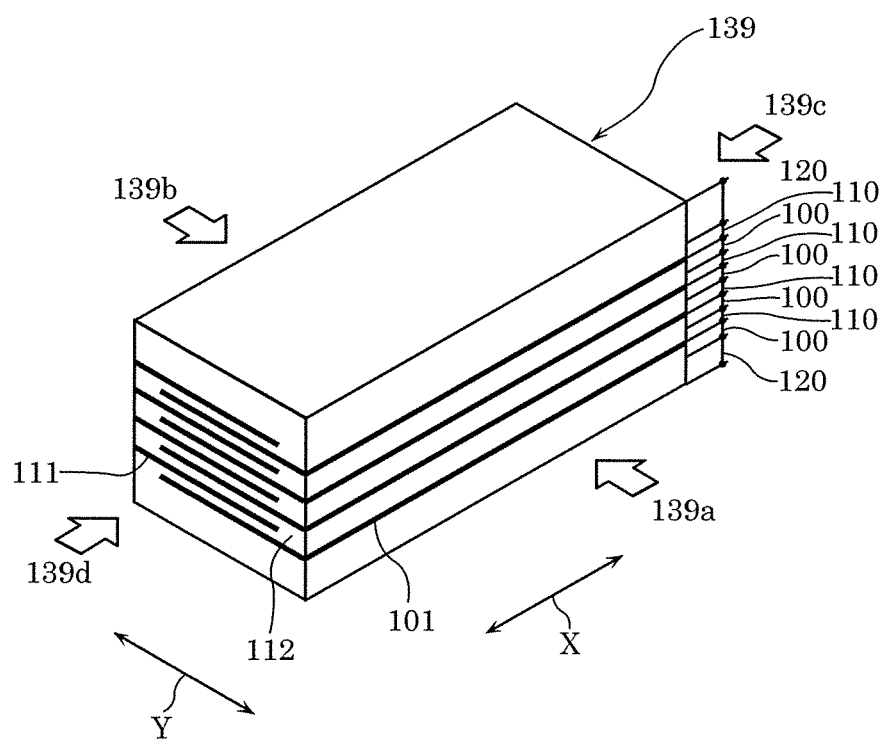
FIG. 9 is a perspective view illustrating a layered body obtained by layering the first, second and third sheets in Embodiment 1.

As illustrated in FIG. 8, these first sheet 100, second sheet 110, and third sheet 120 are layered by alternately placing first sheet 100 and second sheet 110 on lowermost third sheet 120. Finally, third sheet 120 is placed on top of the layers and sintered, resulting in layered body 139 before electrode formation as illustrated in FIG. 9.

Figure 10B:
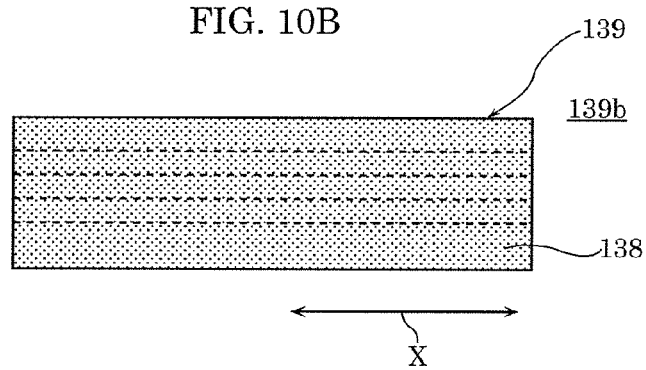
FIG. 10B is a back view illustrating the layered body.
Figure 10C:
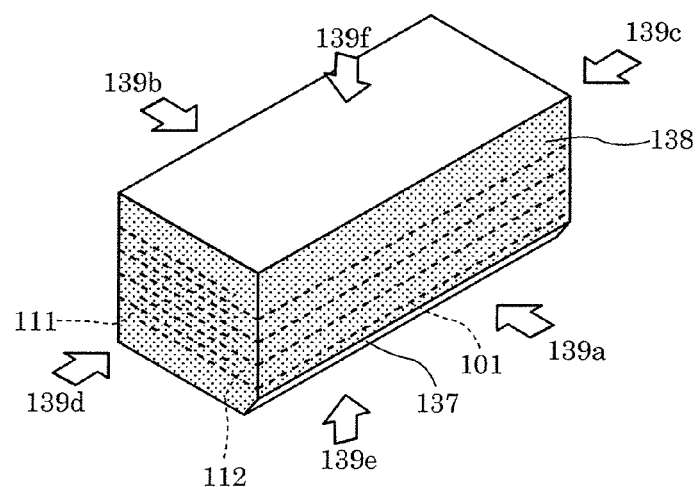
FIG. 10C is a perspective view illustrating the layered body that is partially omitted.

As illustrated in FIG. 10A to FIG. 10C, electrically-conductive film 138 of, for example, a chromium film having a thickness ranging from 1 nm to 10 nm or a gold film having a thickness ranging from 100 nm to 800 nm is formed on all surfaces except lower surface 139e and upper surface 139f of sintered layered body 139 by sputtering or the like as indicated by hatching. It should be noted that chromium may be replaced by titanium and gold may be replaced by silver, platinum, etc.

In this manner, second electrode 111 exposed to second lateral surface 139b of layered body 139 and first electrode 101 exposed to first lateral surface 139a of layered body 139 are electrically connected by electrically-conductive film 138 via fourth lateral surface 139d and third lateral surface 139c of layered body 139. FIG. 10B illustrates second lateral surface 139b of layered body 139.

Next, a lower corner of first lateral surface 139a on a front side of layered body 139 is partially removed as illustrated in FIG. 10C. This removes electrically-conductive film 138 formed in that portion so as to form cut-out portion 137. As described above, layered body 139 having electrodes is completed.

In order to form piezoelectric body 140, layered body 139 of FIG. 10C is diced by a dicer, thereby forming a plurality of grooves 144 at predetermined intervals as illustrated in FIG. 11A. Bottoms of grooves 144 reach cut-out portion 137. These grooves 144 disconnect a portion of electrically-conductive film 138 on second lateral surface 139b and a portion of electrically-conductive film 138 on first lateral surface 139a.

More specifically, electrically-conductive film 138 on first lateral surface 139a is divided into element electrode 138ac that is connected to second electrode 111 and located toward third lateral surface 139c, element electrode 138ad that is connected to second electrode 111 and located toward fourth lateral surface 139d, and a plurality of element electrodes 138a to 138g that are located between element electrode 138ad and element electrode 138ac.

Figure 11B:
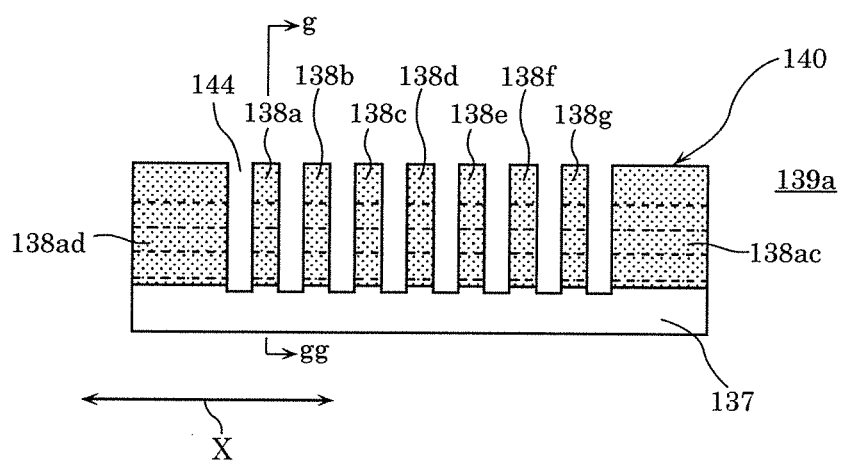
FIG. 11B is a front view illustrating the piezoelectric element obtained by forming the plurality of grooves in the layered body.

FIG. 11B is a view, seen from first lateral surface 139a, illustrating piezoelectric body 140 provided with the plurality of grooves 144 as above. In piezoelectric body 140, a plurality of adjacent piezoelectric bodies U1 to U7 are formed between element electrode 138ad and element electrode 138ac.

Figure 12:
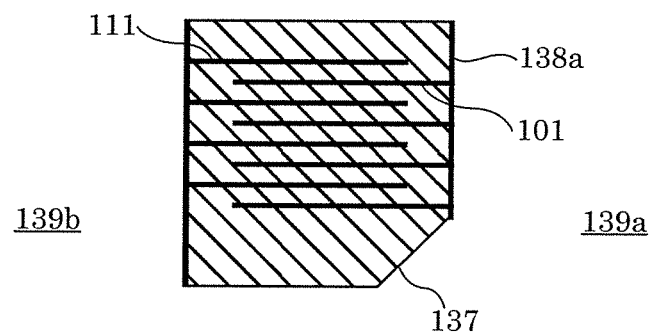
FIG. 12 is a sectional view taken along line g-gg in FIG. 11B.

FIG. 12 illustrates a cross section taken along line g-gg in FIG. 11B.

Incidentally, electrically-conductive film 138 may be provided on a bottom surface instead of the lateral surfaces of layered body 139 so as to connect second lateral surface 139c and element electrode 138ac or element electrode 138ad. When a large amount of current flows, it is appropriate that electrically-conductive film 138 connecting second lateral surface 139c and element electrode 138ac or element electrode 138ad be provided on both of the lateral surfaces and lower surface 139e of layered body 139.

The inkjet head uses this piezoelectric body 140, thereby discharging ink from each nozzle. In other words, the inkjet head can achieve highly-precise inkjet application without any influence among discharge speeds and volumes of droplets from neighboring nozzles. The inkjet head can realize application with high density, high precision and uniformity with reduced variations in a droplet amount through individual nozzle holes.

By executing the processes illustrated in FIG. 1A to FIG. 4E, it is possible to solder flexible cable 3 to element electrodes 138a to 138g of first lateral surface 139a in this piezoelectric body 140 in an excellent manner.

(Resin Softening Process: First Heating Process)

In a heating preparation process illustrated in FIG. 1A to FIG. 2C, resin film 4 of a thermosetting resin is sandwiched between flexible cable 3 and piezoelectric body 140, and they are clamped by tool 5a and tool 5b altogether.

Flexible cable 3 is obtained by forming adjacent substrate electrodes 7a to 7g at intervals on insulating substrate 6 of a heat resistant polyimide resin or the like. At tips of substrate electrodes 7a to 7g, solder layer 8 having a thickness ranging approximately from 5 μm to 30 μm is formed in advance.

Resin film 4 is obtained by processing a thermosetting adhesive of, for example, an epoxy resin into a film shape. Resin film 4 softens at temperature T1 ranging from 70° C. to 150° C. lower than temperature T3 at which solder in solder layer 8 melts, and, at a stage where the temperature is raised by a subsequent heating to temperature T2 ranging from 100° C. to 200° C., undergoes a curing reaction and cures. Temperature T2 is lower than temperature T3 at which the solder in solder layer 8 melts (see Expression 1).

$$T1 < T2 < T3 \qquad \text{Expression 1}$$

By the clamping with tools 5a and 5b, substrate electrodes 7a to 7g are pressed into contact with element electrodes 138a to 138g of piezoelectric body 140 via solder layer 8 and resin film 4.

Figure 2A:
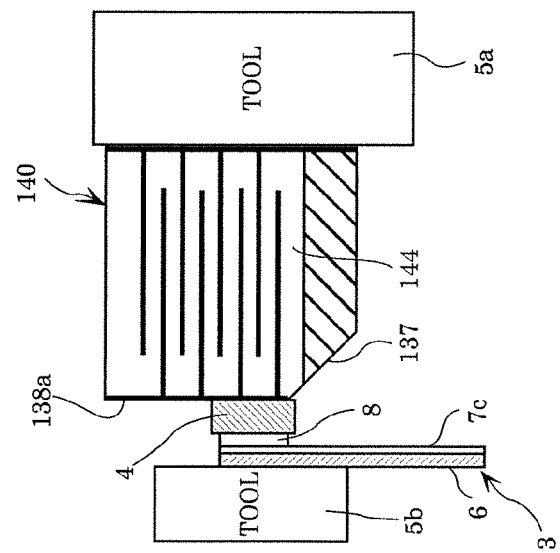
FIG. 2A is a sectional view illustrating a main portion clamped by tools before heated in a production process of the piezoelectric element with the cable substrate in Embodiment 1.
Figure 2B:
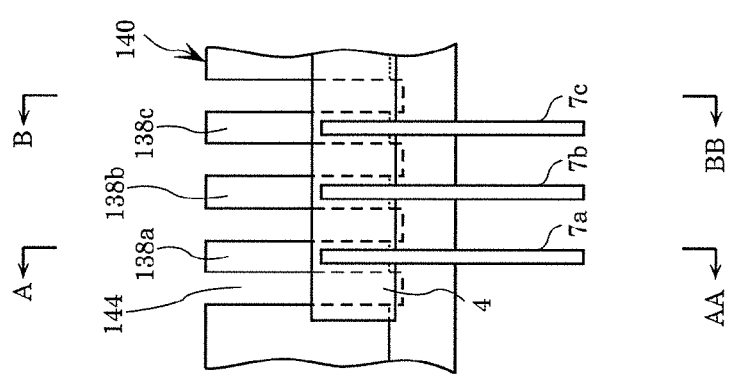
FIG. 2B is a front view illustrating a state clamped by the tools before heated where an insulating substrate is omitted in the production process of the piezoelectric element with the cable substrate in Embodiment 1.
Figure 2C:
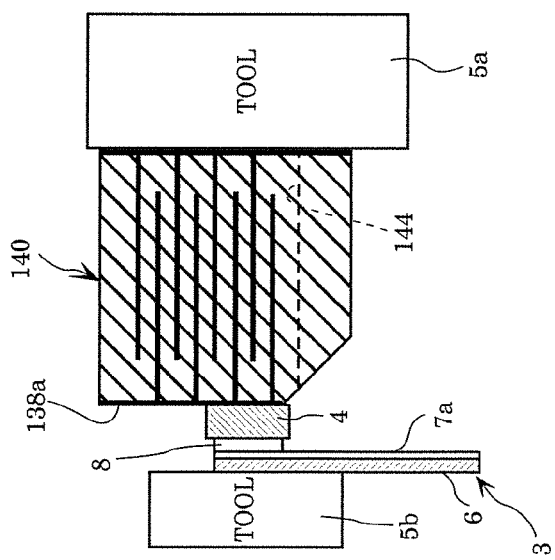
FIG. 2C is another sectional view illustrating a main portion clamped by the tools before heated in the production process of the piezoelectric element with the cable substrate in Embodiment 1.

Here, FIG. 3B illustrates a state viewed from first lateral surface 139a of piezoelectric body 140 similarly to FIG. 2B. FIG. 3C illustrates a cross section taken at the same position as FIG. 2C. In FIG. 3A to FIG. 3C, softened resin film 4 is hatched to indicate that it is different from a thermosetting resin before softening in FIG. 2A to FIG. 2C. Part of the thermosetting resin in resin film 4 that has been softened and moved flows into grooves 144 as illustrated in FIG. 3C.

(Resin Curing Process: Second Heating Process)

Now, in the second heating process, tool 5a and tool 5b clamping piezoelectric body 140 and flexible cable 3 heat and press piezoelectric body 140 and flexible cable 3 into contact with each other until temperature T2 at which resin film 4 cures is reached.

In this way, the thermosetting resin in resin film 4 that has been press-cut and moved to a surrounding portion of substrate electrodes 7a to 7g in the first heating process cures as illustrated in FIG. 3D and FIG. 3E. In order to indicate the difference from the softened thermosetting resin in FIG. 3A to FIG. 3C, the thermosetting resin that has cured is indicated here by dark hatching.

(Solder Melting Process: Third Heating Process)

Figure 4A:
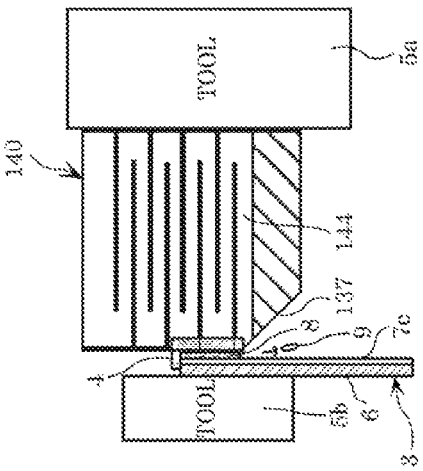
FIG. 4A is a sectional view illustrating a main portion in a state where a solder layer is melted and excess solder is pushed out in Embodiment 1.
Figure 4B:
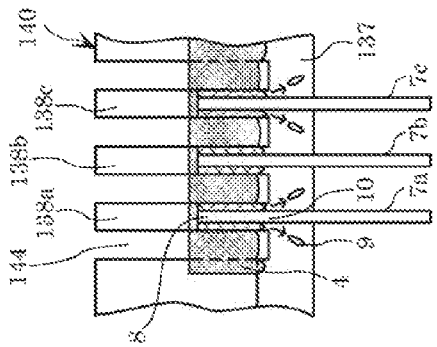
FIG. 4B is a front view illustrating the state of FIG. 4A where the insulating substrate is omitted.
Figure 4C:
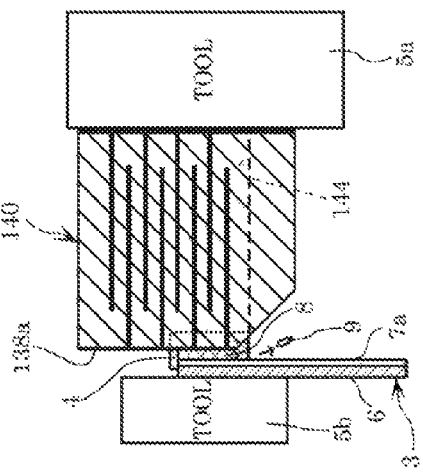
FIG. 4C is another sectional view illustrating the main portion in the state of FIG. 4A.

In a solder melting process illustrated in FIG. 4A to FIG. 4C, tool 5a and tool 5b clamping piezoelectric body 140 and flexible cable 3 heat and press piezoelectric body 140 and flexible cable 3 into contact with each other until temperature T3 at which the solder in solder layer 8 melts is reached. The solder that has melted at temperature T3 wets and adheres to surfaces of element electrodes 138a to 138g of piezoelectric body 140. At this time, if an excessive amount of solder is in solder layer 8, excess solder overflows from electrode adhesion surfaces of piezoelectric body 140.

In the resin curing process, the thermosetting resin in resin film 4 has already cured. In the surrounding portion of element electrodes 138a to 138g of piezoelectric body 140, piezoelectric body 140 and insulating substrate 6 of flexible cable 3 are bonded by the thermosetting resin. Thus, excess solder 9 that has melted from solder layer 8 is pushed out toward cut-out portion 137 from a space between element electrodes 138a to 138g of piezoelectric body 140 and substrate electrodes 7a to 7g along substrate electrodes 7a to 7g having a passage not closed by the thermosetting resin that has cured.

At this time, a passage along a direction from solder layer 8 to grooves 144 is closed by the thermosetting resin that has cured, so that excess solder 9 that has melted from solder layer 8 is not pushed into grooves 144.

Here, cut-out portion 137 is formed between piezoelectric body 140 and flexible cable 3. A space of cut-out portion 137 is formed by partially removing the lower corner of layered body 139 and thus is not pressed sufficiently by tool 5a and tool 5b. As a result, the thermosetting resin in the resin film that has been pushed out to the surrounding portion of the substrate electrodes has slight gap 10 in a portion corresponding to this space. The excess solder flows out through this gap 10.

Figure 4D:
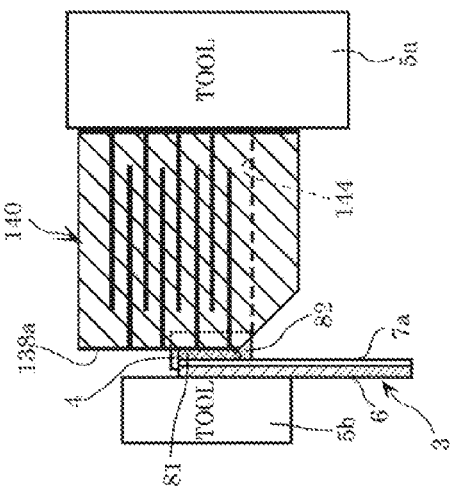
FIG. 4D is a sectional view illustrating a solder solidifying process.
Figure 4E:
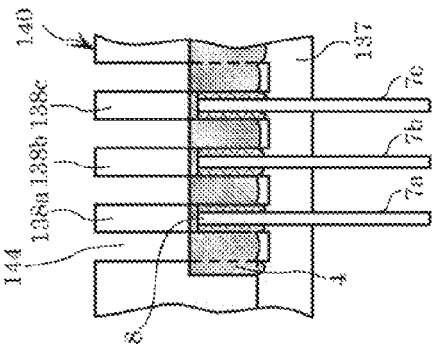
FIG. 4E is a front view illustrating the state of FIG. 4D where the insulating substrate is omitted.

In a solder solidifying process illustrated in FIG. 4D and FIG. 4E, tool 5a and tool 5b clamping piezoelectric body 140 and flexible cable 3 cool down and press piezoelectric body 140 and flexible cable 3 into contact with each other until temperature T0 at which the solder in solder layer 8 solidifies is reached.

In this manner, element electrodes 138a to 138g of piezoelectric body 140 and substrate electrodes 7a to 7g are soldered to each other.

In order to indicate the difference between the solidified solder and the melted solder, the solder in FIG. 4D and FIG. 4E is indicated by darker hatching than the solder in FIG. 4A to FIG. 4C.

More specifically, the space near cut-out portion 137 has a sufficient size for the amount of solder 9 that has overflowed. Thus, excess solder 9 that has overflowed does not move to any other portion from this space. When the heating is finished in this state, the solder starts cooling and curing. An appropriate amount of solder 9 between the element electrodes and the substrate electrodes solidifies, thus completing the connection between these electrodes. Solder 9 that has overflowed also cools, solidifies, and remains at its position in the space.

Here, when the solder between element electrodes 138a to 138g and substrate electrodes 7a to 7g is denoted by first solder 81 and the excess solder is denoted by second solder 82, the first solder 81 and the second solder 82 are continuous (connected).

In this manner, thermosetting resin film 4 is sandwiched between piezoelectric body 140 and flexible cable 3, which are then pressed into contact with each other while heating. Thereafter, the temperature is lowered to solidify the solder. This prevents the entry of solder chips into grooves 144 of piezoelectric body 140, making it possible to achieve a highly-reliable piezoelectric element with a cable substrate.

After flexible cable 3 is joined to element electrodes 138a to 138g of piezoelectric body 140, a gap as large as the thickness of substrate electrodes 7a to 7g is formed between insulating substrate 6 of flexible cable 3 and substrate electrodes 7a to 7g.

In the case where the thickness of resin film 4 is not large enough to fill this gap, if an excessive amount of the solder lies near the remaining gap, excess molten solder may be pushed out from this gap. Thus, resin film 4 that has cured needs to fill the gap substantially completely. In the case where resin film 4 is too thick, the pressure for joining piezoelectric body 140 and flexible cable 3 may not be sufficient to press-cut the softened thermosetting resin, so that solder layer 8 does not contact element electrodes 138a to 138g and substrate electrodes 7a to 7g.

Consequently, resin film 4 may be thicker than substrate electrodes 7a to 7g and thin enough to be press-cut by heating and pressing, and preferably has a thickness ranging from 10 μm to 100 μm.

As illustrated in FIG. 5A, on upper surface 139f of thus produced piezoelectric body 140 with a cable substrate, ink tank 12 having nozzle holes 11 is disposed.

As illustrated in FIG. 6, between diaphragm 13 and nozzle plate 14 having a plurality of nozzle holes 11, ink tank 12 has a plurality of partition walls 16 for separating a plurality of pressure generation spaces 15 that are in communication with nozzle holes 11. Pressure generation spaces 15 are provided in regions corresponding to piezoelectric bodies U1 to U7. Partition wall 16 is provided between the piezoelectric bodies. Ink is filled via an ink supply channel (not shown) in pressure generation spaces 15 defined by diaphragm 13, nozzle plate 14, and partition walls 16.

In inkjet head 2 configured as above, when a voltage signal based on what is to be printed is applied to piezoelectric bodies U1 to U7 via flexible cable 3, piezoelectric bodies U1 to U7 that are supplied with the voltage signal extend. This extension is transmitted via diaphragm 13 to pressure generation spaces 15, and pressurizes the ink inside pressure generation spaces 15, thereby discharging ink droplets through nozzle holes 11.

Incidentally, nozzle holes 11 can be formed in nozzle plate 14 of, for example, a thin metal sheet made of stainless steel or a thin ceramic sheet by laser machining, drilling, press working, etching, electroforming or the like. Considering the degree of flexibility in processing shapes of nozzle holes 11 and the ease of controlling the shapes of nozzle holes 11, it is appropriate to form nozzle holes 11 by laser machining.

Furthermore, depending on the structure of ink tank 12, ink tank 12 may be produced by stacking a plurality of individually processed substrates to form partition walls 16.

Nozzle plate 14 and partition walls 16 are joined by metal junction, an adhesive, or the like. Although any kinds of the adhesive may be employed, it is possible to use a thermosetting adhesive, a two-liquid mixed adhesive, an ultraviolet curing adhesive, an anaerobic adhesive, or an adhesive that cures by a combination of these effects. When the thermosetting adhesive is used, it is appropriate that nozzle plate 14 and partition walls 16 be formed of the same material in order to prevent displacement and warping caused by the difference in thermal expansion coefficient.

Diaphragm 13 may be formed of a plastic film such as a polyimide film, a nickel electroformed film, or the like. In particular, since the ink for producing OLED displays often contains an oil-based solvent such as an aromatic solvent, it is appropriate to use a nickel electroformed film considering solvent resistance.

In the present specification, in order to facilitate the understanding of the structure of piezoelectric body 140, the number of the piezoelectric bodies has been reduced from the actual number, and the pitch of piezoelectric bodies U1 to U7 and the width of grooves 144 have been schematically illustrated. In actual inkjet head 2 and actual piezoelectric body 140, for example, 100 to 200 piezoelectric bodies U1, U2, etc., are adjacently disposed as piezoelectric body 140 along the X direction via grooves 144. The width of grooves 144 depends on the resolution of the inkjet head, and may range from 20 μm to 50 μm for a high-resolution inkjet head.

In such an inkjet head including a piezoelectric element with a cable substrate, an end face of an internal electrode is exposed inside grooves 144 of piezoelectric body 140. Thus, if excess solder at the time of soldering flexible cable 3 to piezoelectric body 140 enters grooves 144, a short-circuit with an adjacent piezoelectric body occurs, so that a signal for a piezoelectric body to be driven is also transmitted to and drives the adjacent piezoelectric body. The vibrations are transmitted via diaphragm 13 to partition walls 16, thus causing unwanted vibrations in pressure generation spaces 15. These vibrations adversely affect the speed, volume and discharge direction of the ink droplets discharged through nozzle holes 11.

Furthermore, if the adjacent piezoelectric body is short-circuited with piezoelectric bodies on both sides, an electric signal transmitted to one of the piezoelectric bodies is also transmitted to the piezoelectric body on the other side via this adjacent piezoelectric body, thereby vibrating both of the piezoelectric bodies. This state is called cross talk. In an inkjet head with the cross talk, a discharge signal transmitted to a nozzle hole causes the ink to be discharged from the adjacent nozzle hole. Thus, such an inkjet head is considered as a defective item.

However, in the inkjet head according to the present embodiment, since flexible cable 3 is soldered to piezoelectric body 140 using resin film 4 of the thermosetting resin so as to prevent the entry of the excess solder into grooves 144, the above-described short-circuit does not occur. Consequently, it is possible to achieve a highly-reliable inkjet head free from the above-mentioned problems.

Incidentally, as illustrated in FIG. 5B, inkjet head 2 is mounted to inkjet apparatus 70. Inkjet head 2 is attached to frame 74, and applies ink to workpiece 72. Stage 73 moves workpiece 72. Frame 74 moves inkjet head 2. Control unit 75 controls these components.

Embodiment 2

Figure 13A:
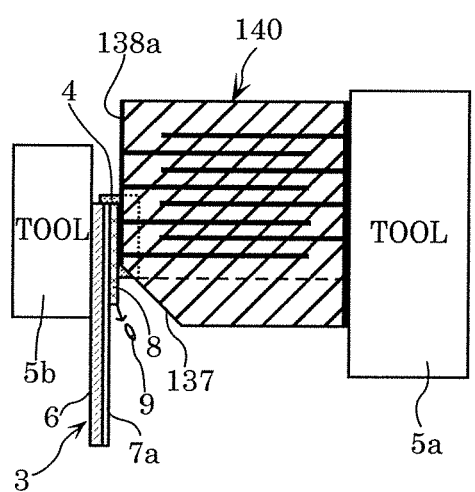
FIG. 13A is a sectional view illustrating a groove portion in a state where a solder layer is melted in a production process of a piezoelectric element with a cable substrate in Embodiment 2.
Figure 13B:
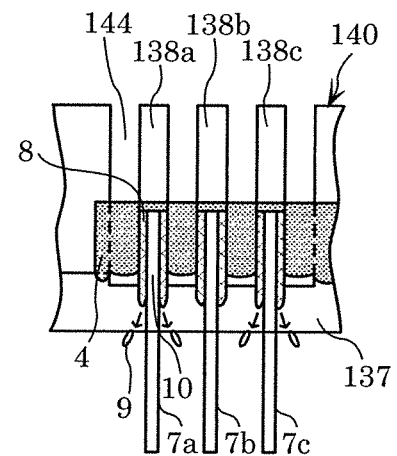
FIG. 13B is a front view illustrating a state where an insulating substrate is omitted in FIG. 13A.

FIG. 13A and FIG. 13B illustrate a piezoelectric element with a cable substrate according to Embodiment 2. FIG. 13A and FIG. 13B illustrate the same states as FIG. 4A and FIG. 4B, respectively.

In Embodiment 1, as illustrated in FIG. 4B, substrate electrodes 7*a* to 7*c* of flexible cable 3 have had a length approximately from a tip of insulating substrate 6 to a lower end of the element electrodes of piezoelectric body 140. However, in Embodiment 2, substrate electrodes 7*a* to 7*c* are extended from the tip of insulating substrate 6 to a portion below the element electrodes of piezoelectric body 140 and further below a bottom portion of grooves 144 of piezoelectric body 140.

Both of an extended portion of solder layer 8 and solder layer 8 that joins substrate electrodes 7*a* to 7*c* of flexible cable 3 and element electrodes 138*a* to 138*c* of piezoelectric body 140 melt at the same time by the heating with tools 5*a* and 5*b*.

At this time, a surface tension of molten solder layer 8 exerts a force in a direction of shrinking the surface. As a result, solder layer 8 has an effect of attracting excess solder toward cut-out portion 137. This effect more reliably prevents excess solder 9 from causing the short-circuit with the adjacent piezoelectric body.

Embodiment 3

Figure 14C:
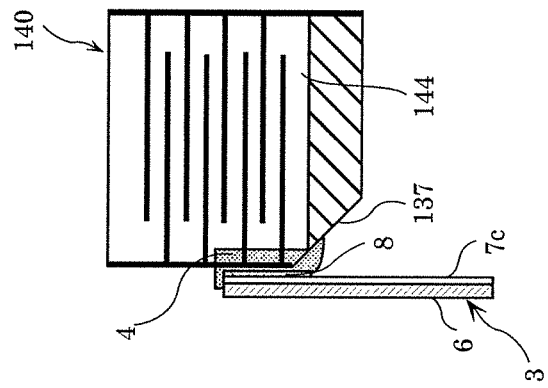
FIG. 14C is a sectional view illustrating a groove portion in a state where the resin film is softened in the production process of the piezoelectric element with the cable substrate in Embodiment 3.
Figure 14B:
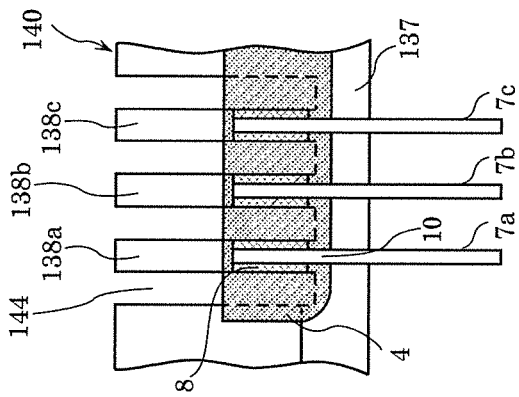
FIG. 14B is a front view illustrating a state where the resin film is softened and the insulating substrate is omitted in the production process of the piezoelectric element with the cable substrate in Embodiment 3.
Figure 14A:
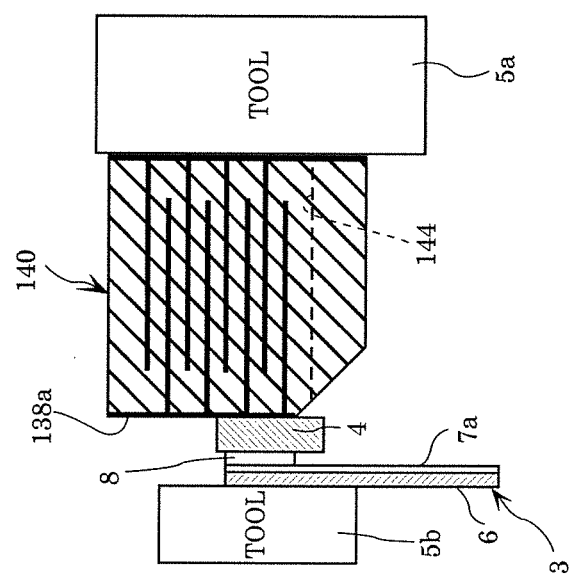
FIG. 14A is a sectional view illustrating a piezoelectric body portion before a resin film is softened in a production process of a piezoelectric element with a cable substrate in Embodiment 3.

FIG. 14A to FIG. 14C illustrate a piezoelectric element with a cable substrate according to Embodiment 3. FIG. 14A illustrates the same state as FIG. 2A. FIG. 14B illustrates the same state as FIG. 2B. FIG. 14C illustrates a cross section at a portion of groove 144 of the piezoelectric element with the cable substrate when the connection is completed.

In Embodiment 1, resin film 4 has extended just before a lower end of an opening of groove 144 as illustrated in FIG. 2B. In Embodiment 3, resin film 4 is extended further below the lower end of the opening of groove 144.

With this configuration, softened resin film 4 is press-cut by heating and pressing by tools 5*a* and 5*b*, and flows into grooves 144. At the same time, the thermosetting resin in the extended portion of resin film 4 flows to cut-out portion 137 of piezoelectric body 140 and cures.

This configuration allows the thermosetting resin that has cured to reliably close the openings of grooves 144 to their lower ends. Thus, even when the overflowing solder deviates from solder layer 8, it can be prevented from moving to other portions. Consequently, in Embodiment 3, it is possible to more reliably prevent the excess solder in the solder layer from causing the short-circuit with the adjacent piezoelectric body.

Furthermore, more effects can be produced by extending solder layer 8 downward as in Embodiment 2.

Figure 15:
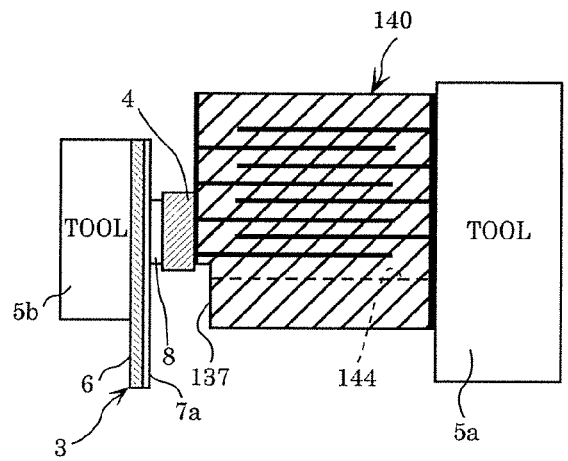
FIG. 15 is a sectional view illustrating a piezoelectric body portion of a piezoelectric element having a rectangular cut-out in Embodiment 3.
Figure 16:
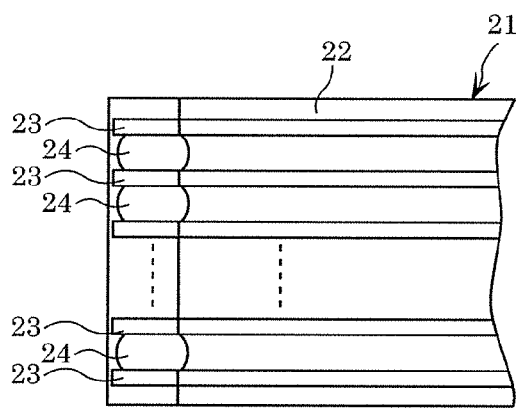
FIG. 16 is a plan view illustrating a conventional cable.
Figure 17:
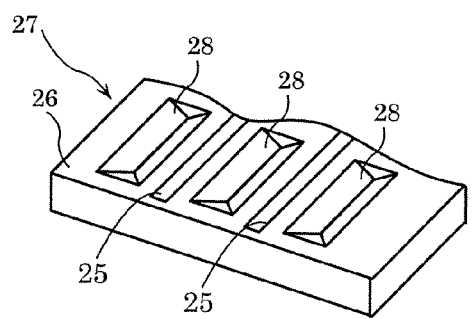
FIG. 17 is an enlarged perspective view illustrating a conventional cable.

In each of the embodiments described above, a part of the lower corner of first lateral surface 139*a* of layered body 139 has been cut out obliquely so as to remove electrically-conductive film 138 formed in that part. As a result, cut-out portion 137 that is inclined in a direction increasing a gap between layered body 139 and insulating substrate 6 has been formed. However, as illustrated in FIG. 15, a similar effect can be produced by cutting out a rectangular portion from piezoelectric body 140 so as to form cut-out portion 137.

In each of the embodiments described above, solder layer 8 has been provided in substrate electrodes 7*a* to 7*g* of flexible cable 3 and not in element electrodes 138*a* to 138*g* of piezoelectric body 140. However, a similar effect can be produced by providing solder layer 8 in element electrodes 138*a* to 138*g* of piezoelectric body 140 instead of substrate electrodes 7*a* to 7*g* of flexible cable 3. Alternatively, a similar effect can be produced by providing solder layer 8 in both substrate electrodes 7*a* to 7*g* of flexible cable 3 and element electrodes 138*a* to 138*g* of piezoelectric body 140.

Resin film 4 formed of the thermosetting resin in each of the embodiments described above can be an anisotropic conductive film (ACF) obtained by dispersing metal-coated resin particles therein, a non conductive film (NCF) in which no particles are dispersed, or the like.

When the ACF is used, electrically-conductive resin particles in the ACF also achieve electrical conduction between piezoelectric body 140 and flexible cable 3. However, in the case of an inkjet head used under an organic solvent atmosphere, a binder resin in resin film 4 slightly swells owing to the organic solvent in the atmosphere with an increase in use period, and the electrically-conductive resin particles in the ACF float up from the surface of the element electrodes, so that the electrical connection cannot be obtained. In particular, since the solvent of the ink used for printing an organic layer in OLED displays is mainly an aromatic organic solvent having a high permeability to resins or an aromatic organic solvent having a heterocycle, the binder resin has a considerable tendency to swell.

Moreover, in inverse proportion to an increase in inkjet head resolution, a connection area between piezoelectric body 140 and flexible cable 3 per piezoelectric body 140 decreases, so that the number of the electrically-conductive resin particles sandwiched in that connection portion also decreases. Thus, it is more likely that the lack of conduction between the electrodes will occur, leading to poor reliability. Consequently, when the ACF is used, a function of providing electrical conductivity is not substantially utilized even if the electrically-conductive resin particles are present in resin film 4.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure contributes to the enhancement of yields of non-defective products of various kinds such as an inkjet head including a piezoelectric element with a cable substrate.

What is claimed is:

1. A piezoelectric element with a cable substrate, comprising:
    a piezoelectric element including a plurality of piezoelectric bodies aligned via grooves;
    a cable substrate including a plurality of substrate electrodes aligned on an insulating substrate;
    solder including first solder that connects the plurality of substrate electrodes and a plurality of element electrodes on surfaces of the plurality of piezoelectric bodies at a first opposing position where the plurality of substrate electrodes and the plurality of element electrodes are opposed to each other; and
    a thermosetting resin that is adjacent to the first solder and connects the plurality of piezoelectric bodies and the insulating substrate,
    wherein the piezoelectric element has a cut-out portion that is adjacent to the plurality of element electrodes and defines a gap between the piezoelectric element and the plurality of substrate electrodes, the gap being greater than a gap between the plurality of element electrodes and the plurality of substrate electrodes at the first opposing position, wherein each of the plurality of substrate electrodes has a width that is smaller than a width of each of the plurality of element electrodes, and wherein the thermosetting resin reaches the grooves but the solder does not reach into the grooves.

2. The piezoelectric element with a cable substrate according to claim 1, wherein the solder further includes second solder in the cut-out portion, the second solder being connected to the first solder located at the first opposing position.

3. The piezoelectric element with a cable substrate according to claim 2, wherein the thermosetting resin is partially within and cured in the grooves between the piezoelectric bodies that are aligned.

4. An inkjet head that discharges ink through a nozzle hole by driving the piezoelectric element with a cable substrate according to claim 1.

5. An inkjet apparatus that applies the ink to a workpiece by using the inkjet head according to claim 4.

6. An inkjet head that discharges ink through a nozzle hole by driving the piezoelectric element with a cable substrate according to claim 2.

7. An inkjet head that discharges ink through a nozzle hole by driving the piezoelectric element with a cable substrate according to claim 3.

8. The piezoelectric element with a cable substrate according to claim 1, wherein the thermosetting resin reaches a position where a passage along a direction from the solder to the grooves defined between lateral surfaces of each of the plurality of substrate electrodes and the cut-out portion of the piezoelectric element are opposed to each other, and the thermosetting resin is not present in the cut-out portion of the piezoelectric element.

9. The piezoelectric element with a cable substrate according to claim 1, wherein the thermosetting resin is present in the cut-out portion of the piezoelectric element.

10. The piezoelectric element with a cable substrate according to claim 1, wherein the first solder is not present in the grooves.

11. The piezoelectric element with a cable substrate according to claim 1, wherein the solder includes the first solder located at the first opposing position and second solder connected to the first solder, the second solder being located on the plurality of substrate electrodes opposed to the cut-out portion, and the second solder not being located in the cut-out portion.

* * * * *